United States Patent [19]

Grider

[11] Patent Number: 4,952,529

[45] Date of Patent: * Aug. 28, 1990

[54] METHOD OF COUPLING A TERMINAL TO A THICK FILM CIRCUIT BOARD

[75] Inventor: Duane M. Grider, Eagan, Minn.

[73] Assignee: Ford Motor Company, Dearborn, Mich.

[*] Notice: The portion of the term of this patent subsequent to Oct. 4, 2005 has been disclaimed.

[21] Appl. No.: 245,495

[22] Filed: Sep. 19, 1988

[51] Int. Cl.$^5$ ............................................. H01R 43/16
[52] U.S. Cl. ................................. 437/209; 29/884; 439/78; 439/83; 439/736; 439/937
[58] Field of Search ............... 437/209, 211, 212, 213, 437/214, 215, 216, 217, 218, 219, 220, 221, 222, 223, 224; 29/834, 842, 854, 876, 877, 882, 884; 439/78, 83, 374, 876, 885, 889; 174/52.4; 361/404, 405

[56] References Cited

U.S. PATENT DOCUMENTS

| | | | |
|---|---|---|---|
| 3,905,665 | 9/1975 | Lynch et al. | 439/885 |
| 4,173,387 | 11/1979 | Zell | 439/78 |
| 4,393,581 | 7/1983 | Cherian | 29/827 |
| 4,593,463 | 6/1986 | Kamono et al. | 439/885 |
| 4,775,333 | 10/1988 | Grider et al. | 439/736 |

Primary Examiner—Olik Chaudhuri
Attorney, Agent, or Firm—Peter Abolins; Keith L. Zerschling

[57] ABSTRACT

A thick film integrated circuit having a terminal with a plurality of parallel legs each having an angled foot portion for connection to the thick film circuit board. An elongated tie bar extends perpendicular to the legs and connects the legs to each other for stabilization. The tie bar has sufficient mass and is positioned sufficiently far from the foot so that heat can be applied to the foot to solder it to the thick film substrate. The legs are positioned in a guide bar with tapered sides to provide a self-centering feature when the terminal is coupled to a connector.

9 Claims, 4 Drawing Sheets

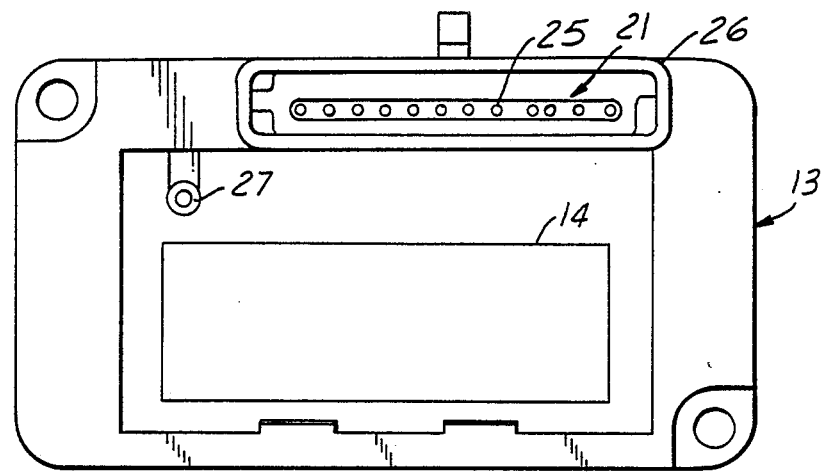
FIG.2
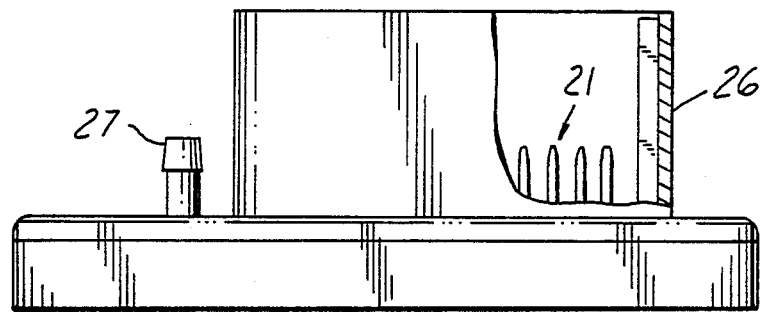
FIG.3
FIG.4
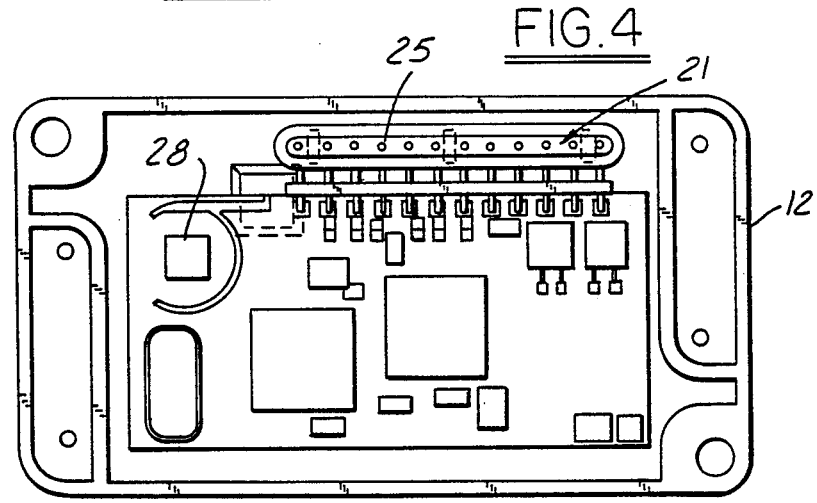

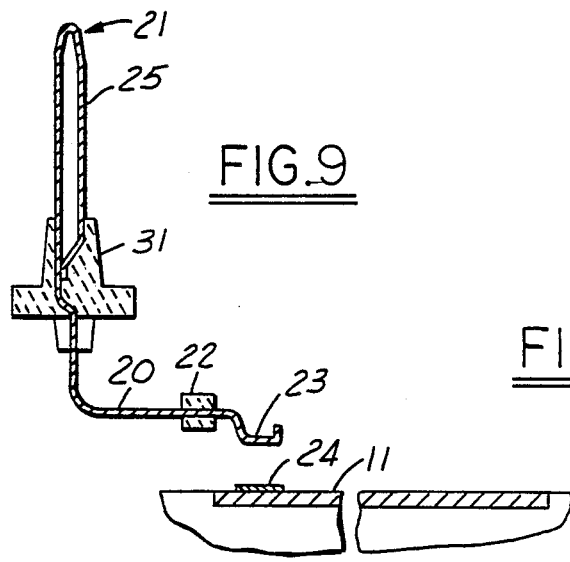
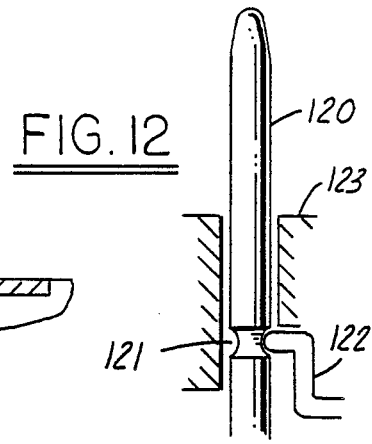
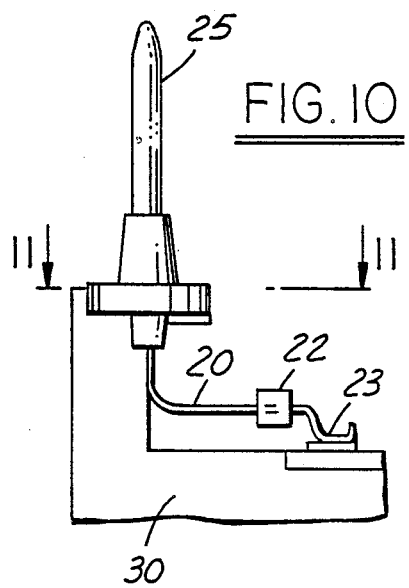
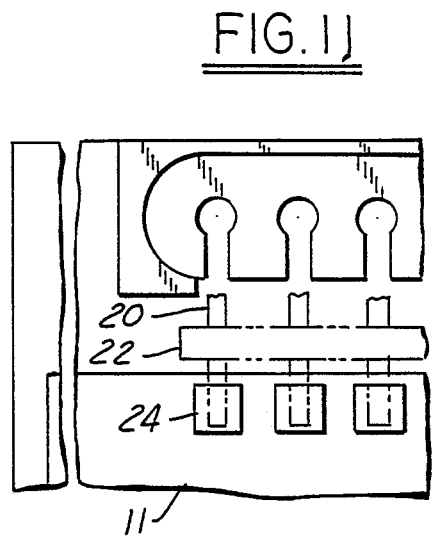

METHOD OF COUPLING A TERMINAL TO A THICK FILM CIRCUIT BOARD

This patent application is related to copending patent application Ser. No. 245,496, entitled THICK FILM CIRCUIT HOUSING ASSEMBLY DESIGN having the same inventor and assignee as herein.

FIELD OF THE INVENTION

This invention relates to construction and design of integrated and thick film circuits.

BACKGROUND OF THE INVENTION

It is known to fabricate a thick film circuit board by attaching electrical terminals to the circuit board after all the other surface components of the thick film circuit board are already in place. This requires an additional manufacturing step, typically soldering in place using wire weld, wire bond, hydrogen flame, nitrogen gas, laser or hand solder reflow. It would be desirable to be able to attach a relatively complex terminal configuration to the thick film circuit board at the same time other components are attached by soldering. Properly positioning the terminals on the circuit board and exposing the terminals to heat when other surface components are attached to the circuit board have both presented problems during fabrication.

It is also known to have terminals extending from a thick film circuit which have to mate with another connector. For accurate mating it is desirable to have these terminals accurately positioned with respect to the thick film circuit, the connector shell and the mating connector. Such accurate positioning has also presented problems during fabrication. These are some of the problems this invention overcomes.

SUMMARY OF THE INVENTION

This invention includes a terminal which has a plurality of parallel legs, each having an angled foot portion to be attached to a thick film circuit board. A longitudinal tie bar extends in a direction perpendicular to the legs and connects the legs to each other for stabilization. The tie bar has sufficient mass and is sufficiently distant from the foot that heat can be applied to the foot to solder it to the thick film circuit board at the same time other components are soldered to the thick film circuit board, without adversely affecting the tie bar. The tie bar also positions the terminals relative to each other and to the thick film circuit board so as to facilitate coupling to another terminal. Advantageously, the terminals have a guide bar with tapered sides for aligning the terminals for connection to a connector shell with tapered openings to receive the tapered sides of the terminal guide bar.

BRIEF DESCRIPTION OF THE DRAWINGS

FIG. 2 is a plan view of a thick film circuit assembly in accordance with an embodiment of this invention;

FIG. 3 is a side view, partly broken away, of the circuit assembly of FIG. 2;

FIG. 4 is a plan view of the circuit assembly of FIG. 2 with the cover plates removed;

FIG. 9 is a section view of a terminal in accordance with an embodiment of this invention before attachment to a thick film substrate;

FIG. 10 is a side view of a terminal in accordance with an embodiment of this invention after attachment to a thick film substrate and associated housing;

FIG. 11 is a partial view along section line 11—11 of FIG. 10; and

FIG. 12 is a side view of a terminal coupling in accordance with the prior art.

DETAILED DESCRIPTION OF THE INVENTION

Figure 1:
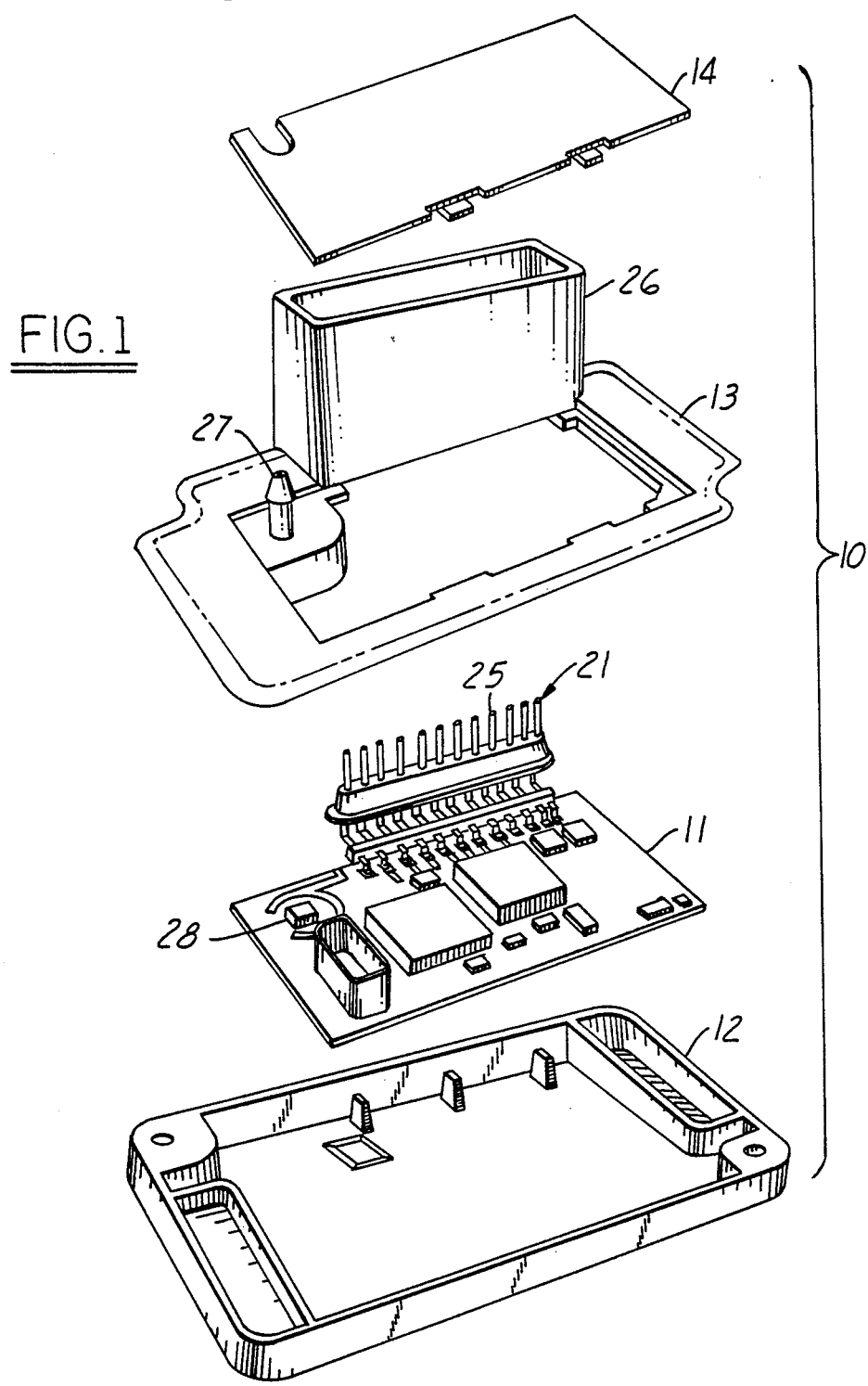
FIG. 1 is an exploded perspective view of a thick film circuit assembly in accordance with an embodiment of this invention.
Figure 5:
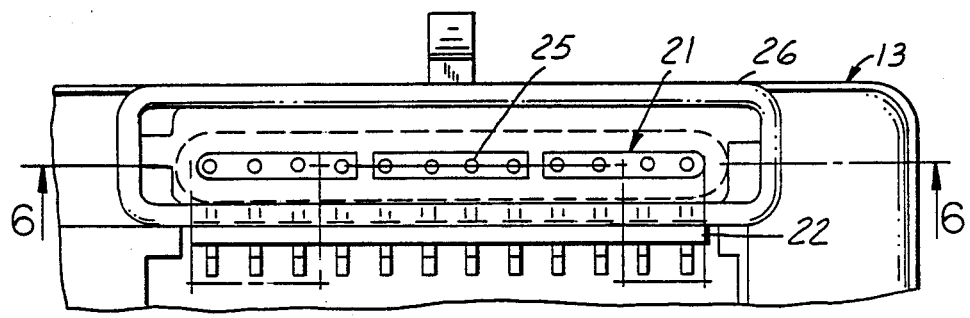
FIG. 5 is a plan view of the terminal portion of the thick film assembly of FIG. 4.
Figure 6:
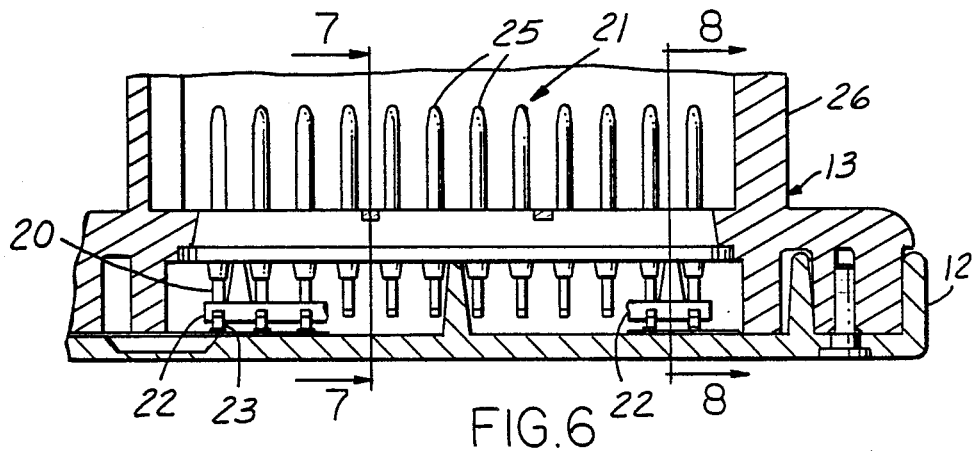
FIG. 6 is a section view of the terminal portion along section line 6—6 of FIG. 5.

Referring to FIG. 1, a thick film circuit assembly 10 includes a thick film circuit board 11 which is positioned in a bottom housing 12 and covered by a top housing 13 with an access panel 14. A terminal 21 has a plurality of electrical connectors 25 with legs 20 and is coupled to thick film circuit board 11. Various other sensors and integrated circuits are also coupled to the circuit board 11. Thick film circuit board 11 is fabricated by forming a supporting substrate for the thick film integrated circuit and forming a semiconductor circuit on the supporting substrate. Further, a path of conducting material and solder pads are formed on the semiconductor circuit. Discrete circuit components and terminal 21 are positioned on the combination of the supporting structure, semiconductor circuit, conducting material and solder pads. This assembly is heated to cause solder reflow and attachment of terminal 21 and the discrete circuit components.

FIGS. 2, 3 and 4 show the assembled thick film circuit assembly with electrical connectors 25 coupled to legs 20 and extending into a support guide portion 26 of housing 13. Housing 13 also includes a coupling nozzle 27 for coupling to pressure sensor 28 located on circuit board 11 (FIG. 4).

FIGS. 5, 6, 7 and 8 show how electrical connectors 25 extend into legs 20 which then are coupled to each other by tie bar 22 and extend into angled foot 23. Tie bar 22 is an elongated member which is generally perpendicular to legs 20. Typically, tie bar 22 is formed of a plastic material.

FIG. 9 shows circuit board 11 and terminal 21 before assembly. A solder pad 24 on circuit board 11 is positioned to be coupled to a foot 23, which is an angled end portion of leg 20 adjacent to tie bar 22.

In FIG. 10, solder pad 24 has been reflowed to couple to angles foot 23. A support 30 is used to hold terminal 21 and circuit board 11 during the solder reflow process. In some applications it may be advantageous to remove support 30 from the completed circuit. Tie bar 22 is sufficiently spaced from foot 23 and is of sufficient mass so that it is not damaged when the heat of melted solder is applied to foot 23 during solder reflow. Thus tie bar 22 continues to properly support, align and stabilize terminal 21 before, during and after the solder reflow process. More particularly, an advantageous material for tie bar 22 is a liquid crystal polymer having a relatively small coefficient of expansion. Tie bar 22 can have a square cross section, each side being about 1.8 mm and the center of tie bar 22 being spaced about 1.625 mm from circuit board 11.

Figure 7:
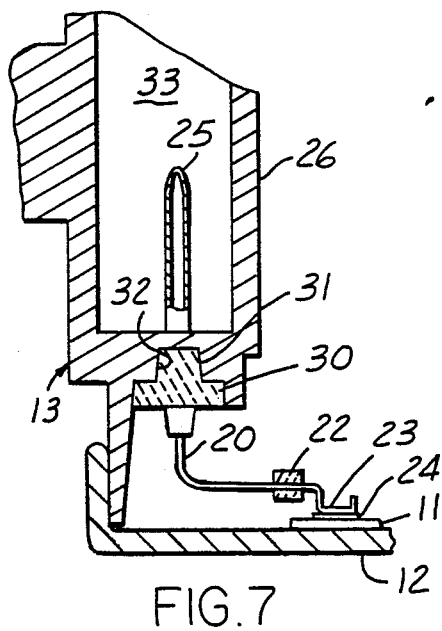
FIG. 7 is a section view along section line 7—7 of FIG. 6.
Figure 8:
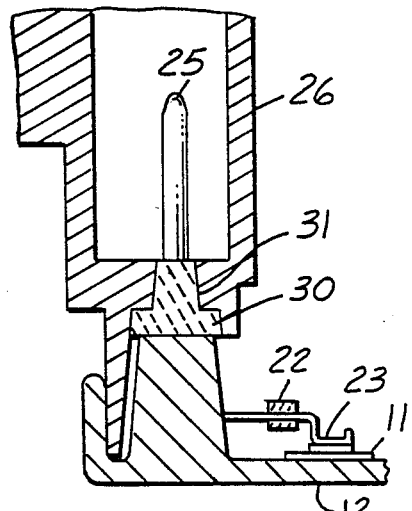
FIG. 8 is a section view along section line 8—8 of FIG. 6.

FIGS. 7 and 8 show how a guide bar 30 connecting all the legs 20 of terminal 21 helps position terminal 21 within support guide portion 26. Guide bar 30 has tapered sides 31 which are received by a tapering opening 32 of support guide portion 26. As a result, electrical connectors 25 are accurately centered within an opening 33 in support guide portion 26. When another connector is coupled to electrical connectors 25 within support guide portion 26 there is a self-centering effect which provides correct alignment and rapid connection. If desired the functions of guide bar 30 and tie bar 22 can be combined into one bar. That is, the combined bar has tapered sides and has sufficient mass and distance from the heated end of the terminal so as not to deform or be otherwise damaged.

FIG. 12 shows a prior art terminal retainer wherein vertical motion along the longitudinal length of an elongated terminal 120 is restricted by interference between a notch 121 in terminal 120 and a spring retainer 122. However, side to side movement occurs because of the space between terminal 120 and a support block 123. This side to side motion can be eliminated in accordance with this invention as shown in FIG. 7 by the use of guide bar 30.

Various modifications and variations will no doubt occur to those skilled in the art to which this invention pertains. For example, the particular size and number of terminals may be varied from that disclosed herein. These and all other such variations which basically rely on the teachings through which this disclosure has advanced the art are properly considered within the scope of this invention.

I claim:

1. A method of fabricating a thick film integrated circuit assembly having a thick film circuit board including the steps of:

forming a terminal having a plurality of parallel legs with an angled foot portion for connection to the thick film circuit board;

connecting the legs to each other for stabilization using a elongated tie bar extending generally perpendicularly to the legs; and forming the tie bar with sufficient mass and positioning it a sufficient distance from the foot so that, without damage to the tie bar, heat can be applied to the foot to solder the terminal to the thick film circuit board thereby electrically and physically connecting the terminal to the thick film circuit board at the same time other components are connected to the thick film circuit board.

2. A method of fabricating a thick film integrated circuit assembly as recited in claim 1 further including the steps of:

forming a supporting substrate for the thick film integrated circuit;

forming a semiconductor circuit on the supporting substrate;

forming a path of a conducting material and solder pads on the semiconductor circuit;

positioning discrete circuit components and the terminal on the combination of the supporting structure, semiconductor circuit, conducting material, and solder pads; and heating to cause solder reflow and attachment of the terminal and the discrete circuit components.

3. A method fabricating a thick film integrated circuit assembly as recited in claim 2 wherein said heating step includes laser welding by applying laser energy to the solder.

4. A method of fabricating a thick film integrated circuit assembly as recited in claim 2 wherein the step of forming the tie bar includes tapering the tie bar so as to form a self-centering guide for the tie bar when the tie bar is being inserted into an opening.

5. A method fabricating a thick film integrated circuit assembly as recited in claim 2 further comprising the step of forming a tapered guide bar extending generally perpendicularly to the legs and spaced from and parallel to the tie bar, so as to form a self-centering guide when the terminal is inserted into an opening.

6. A method of fabricating a thick film integrated circuit assembly having a terminal and a thick film circuit board including the steps of:

forming a conductive terminal having a plurality of parallel legs each with an angled foot portion for connection to the thick film circuit board;

forming an elongated tie bar extending perpendicular to the legs and connecting the legs to each other for stabilization;

forming the tie bar of sufficient mass and of sufficient distance from said foot so that heat can be applied to the foot to solder it to the thick film circuit board without damaging the tie bar; and connecting the terminal to the thick film circuit board at the same time other additional components are connected to the thick film circuit board.

7. A method of fabricating as recited in claim 6 further comprising fabricating a self-centering terminal by forming a tapered base around said terminal, said base tapering away from the foot portion.

8. A method of fabricating as recited in claim 7 further comprising the step of:

supporting the terminal and the thick film circuit board using a side support during the step of connecting the terminal to the thick film circuit board.

9. A method of fabricating as recited in claim 8 further comprising the step of:

removing the side support from the thick film integrated circuit assembly.

* * * * *